United States Patent [19]

Torii et al.

[11] 4,271,531
[45] Jun. 2, 1981

[54] FREQUENCY SYNTHESIZER

[75] Inventors: Ken-Ichi Torii, Yokohama; Takeshi Shima, Sagamihara, both of Japan

[73] Assignee: Tokyo Shibaura Denki Kabushiki Kaisha, Kawasaki, Japan

[21] Appl. No.: 48,984

[22] Filed: Jun. 15, 1979

[30] Foreign Application Priority Data

Jun. 19, 1978 [JP] Japan .................................. 53/73874

[51] Int. Cl.$^3$ .......................... H04B 1/16; H03L 7/18
[52] U.S. Cl. .................................. 455/182; 455/183; 331/1 A; 331/18
[58] Field of Search ...................... 331/1 A, 18, 25, 34; 455/165, 183, 260, 182, 192; 358/191.1, 195.1

[56] References Cited

U.S. PATENT DOCUMENTS

| | | | |
|---|---|---|---|
| 3,949,304 | 4/1976 | McClaskey | 325/421 |
| 4,024,476 | 5/1977 | Briggs | 325/421 |
| 4,121,162 | 10/1978 | Alberkrack et al. | 325/421 |
| 4,123,724 | 10/1978 | Das et al. | 325/421 |

OTHER PUBLICATIONS

Japanese Pat. No. 28737/78, "A Variable Frequency Divider".
Japanese Pat. No. 136272/76, "A Frequency Synthesizer".
Japanese Pat. No. 5954/78, "Oscillator".

Primary Examiner—Jin F. Ng
Attorney, Agent, or Firm—Oblon, Fisher, Spivak, McClelland & Maier

[57] ABSTRACT

In a frequency synthesizer with phase-locked loop in which the output signal from a voltage controlled oscillator is frequency-divided by a variable frequency dividing circuit and the frequency-divided one, together with a reference frequency signal, is applied to a phase comparator and the output signal from the phase comparator is fed back to the voltage control oscillator, the variable frequency dividing circuit is comprised of a first variable frequency divider for frequency-dividing the frequency of the output signal from the voltage controlled oscillator into a 1/K frequency, a second variable frequency divider for frequency-dividing the frequency of the output signal from the first variable frequency divider into a 1/m frequency, and a rate multiplier which receives the output signal from the second variable frequency divider to produce Q pulses (Q is an integer between 0 to P-1 where P is an integer) when receiving P input pulses, and to change the frequency dividing ratio K of the first variable frequency divider.

7 Claims, 10 Drawing Figures

FREQUENCY SYNTHESIZER

The present invention relates to a frequency synthesizer with a phase-locked loop.

A frequency synthesizer with a phase-locked loop has been used as an internal signal source in a superheterodyne transmitter or receiver, a measurement equipment and the like. In FIG. 1 illustrating a general construction of a conventional frequency synthesizer, an output signal with a frequency $f_{oi}$ from a voltage controlled oscillator (VCO) 1 is applied to a variable frequency dividing circuit 2 where the frequency of the output signal is divided into 1/N (here, N is an integer). The output signal with $f_{oi}/N$ from the variable frequency dividing circuit 2 is applied to a phase comparator 3 where the phase of the output signal is compared with the phase of a reference output signal with a stable frequency $f_{ref}$ produced from a crystal oscillator, for example. The output signal of the comparator 3 has an amplitude corresponding to a phase difference between the signal with $f_{oi}/N$ and the signal with $f_{ref}$. The output signal from the comparator 3 is fed back to VCO 1, by way of a low-pass filter, or a loop filter 5.

In the frequency synthesizer thus constructed, when the signal with $f_{oi}/N$ is phase-locked by the signal with $f_{ref}$, the following equation holds.

$$f_{oi} = N \cdot f_{ref} \qquad (1)$$

As seen from the equation (1), the frequency synthesizer with the phase-locked loop can produce an output signal with a stable high frequency synchronized with a stable frequency signal produced from a crystal oscillator or the like in the form of an output signal of VCO 1.

Since the frequency dividing ratio N of the variable frequency dividing circuit 2 is an integer, a discrete step of change $\Delta f$ of the oscillating frequency $f_{oi}$ of VCO 1 which is obtained by externally controlling the frequency dividing ratio N, is induced from the equation (1) and expressed as $$\Delta f = f_{ref} \qquad (2)$$

The equation (2) implies that, in order to obtain a further minute discrete step of change $\Delta f$, the frequency $f_{ref}$ of the reference oscillator 4 must be set up as small as possible. As a result, the ratio N of the variable frequency dividing circuit 2 must be increased by an amount of the frequency $f_{ref}$. Increase of the ratio N decreases the loop gain of the phase-locked loop and makes slow the response speed of the closed loop system, thus damaging a high stability of the oscillating frequency which is an inherent characteristic of the type frequency synthesizer.

One of the methods to solve such disadvantages is to employ an LC oscillator with a relatively wide range of frequency variation in place of an oscillator of which the oscillating frequency is fixed such as a crystal oscillator, for the reference oscillator 4. In this method, the frequency $f_{ref}$ per se may be changed relatively finely but the oscillating frequency of the LC oscillator is unstable and hence the stability of the oscillating frequency of VCO also is remarkably damaged. Thus, this method is impracticable.

Another method to solve such disadvantages is to control the reference oscillator 4 by a phase-locked loop. This method as well as the former method, has inherently the following disadvantages.

When the oscillating frequency $f_{ref}$ of the reference oscillator 4 is increased by $\epsilon$, it is given by $$f'_{ref} = f_{ref} + \epsilon \qquad (3)$$

From the equation (1), the oscillating frequency $f'_{oi}$ of VCO 1 is expressed as $$f'_{oi} = N \cdot f'_{ref} = f_{oi} + N \cdot \epsilon \qquad (4)$$

This equation (4) implies that, when the oscillating frequency of the reference oscillator 4 is increased by $\epsilon$, the oscillating frequency of VCO 1 changes by $N \cdot \epsilon$. Since N is the frequency dividing ratio of the variable frequency dividing circuit 2 and is variable, N changes inevitably the discrete step of change $\Delta f$ ($= N \cdot \epsilon$) of the oscillating frequency of VCO 1.

Accordingly, an object of the invention is to provide a frequency synthesizer which may provide a finer discrete step of change of the oscillating frequency of VCO without excessively increasing the frequency dividing ratio N of the variable frequency dividing circuit, although it uses an oscillator with a stable fixed frequency of VCO, and further may keep the amount of the discrete change constant irrespective of the frequency dividing ratio of the variable frequency dividing circuit.

According to the invention, there is provided a frequency synthesizer comprising: a variable frequency dividing circuit for frequency-dividing an output signal from VCO and applying the frequency-divided one to one input terminal of a phase comparator; said variable frequency dividing circuit including, a first variable frequency divider for frequency-dividing an oscillating output signal from VCO or, from a preceding stage frequency divider directly connected to VCO, into a 1/K (K=an integer) frequency, a second variable frequency divider for frequency-dividing an output signal from the first variable frequency divider or, from a preceding stage frequency divider directly connected to the first variable frequency divider into a 1/m (m=an integer) frequency; and a rate multiplier which receives an output signal from the second variable frequency-divider, an output signal from a reference oscillator or, from a preceding stage frequency divider directly connected to the reference oscillator, and produces output pulses of Q ($0 \leq Q \leq P-1$ where P is an integer) when it receives input pulses of P, thereby to change the frequency dividing ratio of the first variable frequency divider by the output pulses of the rate multiplier. The frequency dividing circuit can change the frequency dividing ratio N to have a minute value below a decimal point, with uniform intervals. Therefore, if this variable frequency dividing circuit is applied to the phase-looked loop of the frequency synthesizer, the discrete change of the frequencies to be synthesized may readily be made finer and more uniform.

This invention can be more fully understood from the following detailed description when taken in conjunction with the accompanying drawings, in which.

Figure 1:
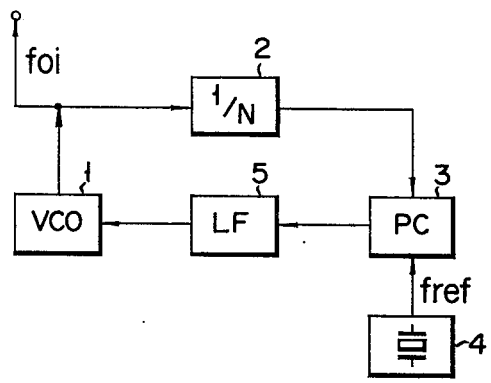
FIG. 1 shows a block diagram of a conventional frequency synthesizer.
Figure 2:
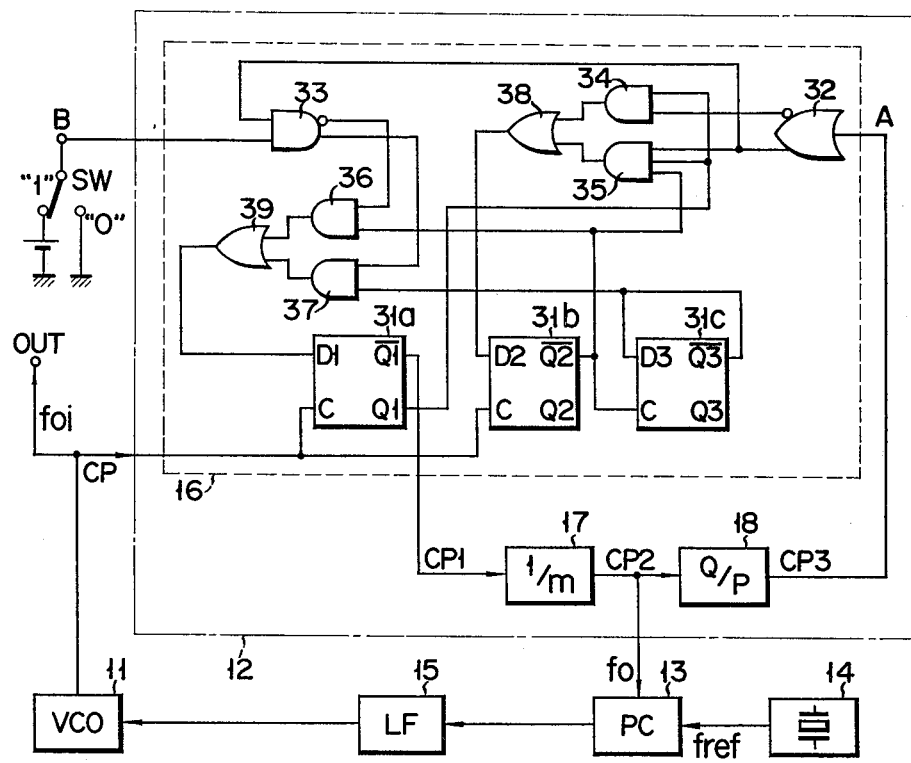
FIG. 2 shows a block diagram of an embodiment of the frequency synthesizer according to the invention.

In FIG. 2 illustrating an embodiment of the frequency synthesizer according to the invention, a block enclosed by a one-dot line is a variable frequency-dividing circuit 12 used in this embodiment which corresponds to the variable frequency dividing circuit 2 shown in FIG. 2. The variable frequency divider 12 receives a pulse signal CP with a frequency $f_{oi}$ outputted from VCO 11 and properly frequency-divides the frequency $f_{oi}$ and finally applies the frequency-divided signal as an output signal f0 to one of the input terminals of a phase comparator 13. The other input of the phase comparator 13 is supplied with an output signal with a frequency $f_{ref}$ delivered from a stable reference oscillator, for example, a crystal oscillator 14. In the comparator 13, the signal with the frequency $f_{ref}$ is compared in the phase with the signal with the frequency f0 from the variable frequency divider 12. The output signal from the phase comparator 13 which is formed corresponding to a phase difference between both the signals of frequencies $f_{ref}$ and f0 is applied to a loop filter 15 where it is converted into a substantial DC voltage. The converted DC voltage is then applied as a frequency control signal to a control input terminal of VCO 11.

The output signal of the frequency synthesizer thus constructed is taken out from an output terminal OUT. The frequency $f_{oi}$ of the output signal is variable determined by the variable frequency dividing circuit 12 in the following manner.

The variable frequency dividing circuit 12 is comprised of a first variable frequency divider 16 enclosed by a dashed line which frequency-divides the frequency $f_{oi}$ of the pulse CP from VCO 11 into a 1/K frequency and produces an output pulse CP1, a second variable frequency divider 17 which further frequency-divides the pulse CP1 with the frequency $f_{oi}/K$ into a 1/m frequency and produces a pulse CP2 with the frequency $f_{oi}/Km$, and a rate multiplier 18 which produces Q pulses of signal CP3 ($0 \leq Q \leq P-1$ where P, Q are integers) when it receives P pulses of signal CP2. The output pulse CP3 of the rate multiplier 18 is applied to the variable frequency divider 16 to change the frequency dividing ratio K of the circuit 16. The output pulse CP2 from the second variable frequency divider 17 has a frequency f0 and is also applied to the phase comparator 13.

Figure 3:
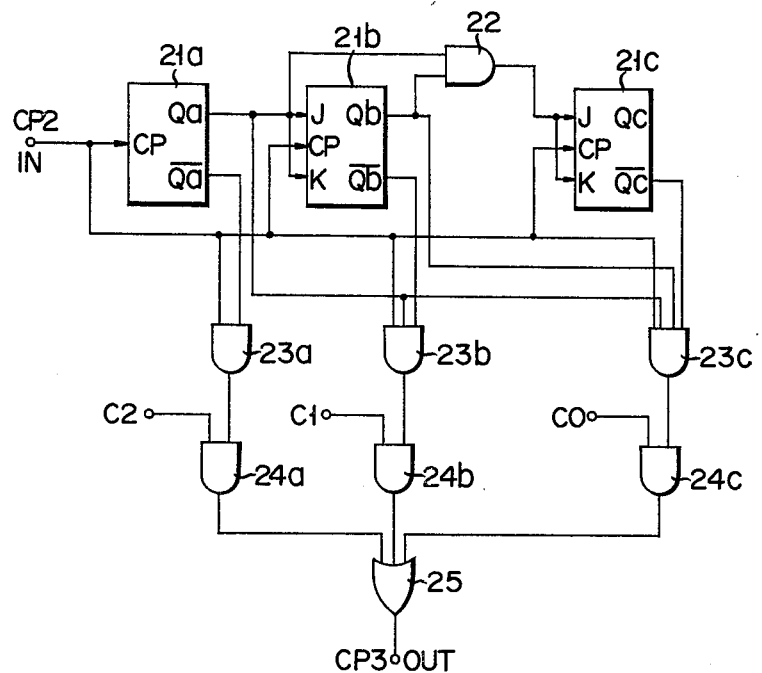
FIG. 3 shows a block diagram of an example of a rate multiplier shown in FIG. 2.

The rate multiplier 18 will be described in more detail. FIG. 3 shows a circuit diagram of the rate multiplier 18 when P=8, Q=0 to 7. The output signal CP2 from the second variable frequency divider 17 is applied through an input terminal IN to CP terminals of first to third flip-flops 21a to 21c and one input terminal of each of AND gates 23a to 23c. An output Qa of the flip-flop 21a is applied to J and K input terminals of the J-K flip-flop 21b and to the other input terminals of the AND gates 23b and 23c, and further to one input terminal of an AND gate 22. The output $\overline{Q}a$ of the flip-flop 21a is supplied to the other input terminal of the AND gate 23a. The output Qb of the J-K flip-flop 21b is applied to the other input of the AND gate 23c and also to the J and K terminals of the J-K flip-flop 21c through the AND gate 22 and the output $\overline{Q}b$ is applied to the other input terminal of the AND gate 23b. The output $\overline{Q}c$ of the J-K flip-flop 21c is supplied to the other input terminal of the AND gate 23c. In this way, the flip-flops 21a to 21c cooperate to form a synchronous counter of 3-bit type.

The output signals from the AND gates 23a to 23c selectively pass through AND gates 24a to 24c which are gate-controlled by control signals c0, c1 and c2, and then pass through an OR gate 25 to go out from an output terminal OUT connecting to the output of the OR gate 25 in the form of an output signal CP3. Those control signals c0 to c2 will be described later in detail.

Figure 4:
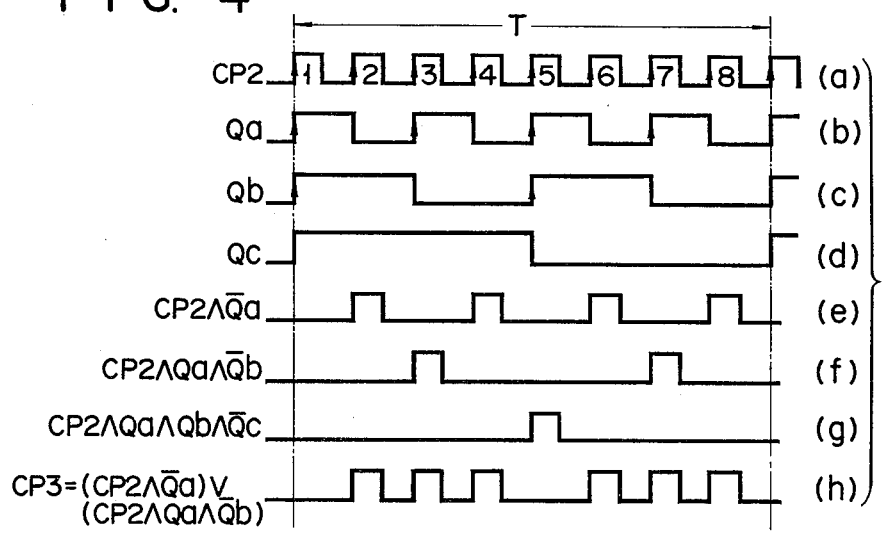
FIG. 4 shows a set of timing diagrams useful in explaining the operation of the rate multiplier shown in FIG. 3.

Assume now that the respective flip-flops 21a to 21c respond to the leading edge of the input pulse CP2 (the output pulse from the variable frequency divider 16) shown in FIG. 4(a). The output signals Qa to Qc take waveforms as shown in FIGS. 4(b) to (d) while the output signals $\overline{Q}a$ to $\overline{Q}c$ (not shown) are the inverted signals of Qa to Qc, respectively. The AND gate 23a produces a logical product of the input signal CP2 and the output signal $\overline{Q}a$ (CP2∧$\overline{Q}a$). The output signal of the AND gate 23a is as shown in FIG. 4(e). The AND gate 23b produces a logical product of three signals CP2, Qa, and $\overline{Q}b$ (CP2∧Qa∧$\overline{Q}b$) and its output signal takes a waveform as shown in FIG. 4(f). The AND gate 23c produces a logical product of four signals CP2, Qa, Qb and $\overline{Q}c$ (CP2∧Qa∧Qb∧$\overline{Q}c$) and the output signal is as shown in FIG. 4(g). In this way, when receiving eight input pulses of CP2, the AND gates 23a, 23b and 23c produce four pulses, two pulses and one pulse at different timings, respectively. The output signals of the AND gates 23a to 23c are selectively taken out from the AND gates 24a, 24b and 24c in response to the control signals c2, c1 and c0, and these are combined in an OR gate 25 which in turn produces the output pulse CP3 and outputs it from a terminal OUT. The control signals c2, c1 and c0 are signals each of which continue for at least a period T of eight input pulses CP2, as shown in FIG. 4(a). Accordingly, by combining the control signals c2, c1 and c0, the number of the clock pulses CP3 within the period T may be properly changed from 0 to 7. For example, when control signals c2 and c1 are selected to be a logical "1" and control signal c0 is selected to be a logical "0", then an output signal CP3 includes six pulses as shown in FIG. 4(h). The pulse signal CP3 thus formed is applied, as the output of the rate multiplier 18, to the first variable frequency divider 16.

The frequency dividing ratio K of the first variable frequency divider 16 is changed, for example, from K=K1 to K=K1+1 or K=K1−1 by the output pulses from the rate multiplier 18. The first variable frequency divider 16 shown in FIG. 2 is the circuit construction when K1=4. The first variable frequency divider 16 has D-type flip-flops 31a, 31b and 31c. The output pulse CP of VCO 11 is supplied to the terminals C of the D-type flip-flops 31a and 31b. The output $\overline{Q}1$ of the D-type flip-flop 31a is applied as the output pulse CP1 to the second variable frequency divider 17. The output Q1 of the D-type flip-flop 31a is supplied to one input terminal of each of AND gates 34 and 35. The other input terminals of the AND gates 34 and 35 are coupled with the inverted output terminal and the non-inverted output terminal of a buffer gate 32 which is supplied with the output pulse of the rate multiplier 18. The non-inverted output terminal of the buffer gate 32 is coupled with one input terminal of an AND gate 33 of which the other input terminal is supplied with a control signal B having "1" state and "0" state. The states "1" and "0" of the control signal B is determined by a switch SW having one terminal connected to the ground and the other terminal connected to the ground through a DC source. The control signal B determines whether the frequency dividing ratio K is changed from K1 (=4) to K1−1 (=3) or to K1+1 (=5) in accordance with the output signal CP3 of the rate multiplier 18. For example, when the signal A=1 is supplied to the buffer 32 while the signal B is set "1", the frequency dividing ratio K is changed to K1+1, and while the signal B is set "0", the ratio K is changed to K1−1.

The inverted output of the AND gate 33 is applied to one input terminal of an AND gate 36 while the non-inverted output terminal is coupled with one input terminal of an AND gate 37. The other input terminal of the AND gate 36 is coupled with the output Q2 of the flip-flop 31b which also is coupled with the other input terminal of the AND gate 35 and the terminal c of the flip-flop 31c. The outputs of the AND gates 34 and 35 are supplied to the terminal D2 of the flip-flop 31b through an OR gate 38 and the output Q3 of the flip-flop 31c is applied to the terminal D3 of the flip-flop 31c and the other input terminal of the AND gate 37. The outputs of the AND gates 36 and 37 are coupled with the terminal D1 of the flip-flop 31a through an OR gate 39.

If the output signal CP3 of the rate multiplier 18 is expressed by A, the construction of the first variable frequency divider 16 may be expressed by the following logical expressions.

$$D1 = (A \wedge B \wedge \overline{Q3}) V (\overline{A \wedge B} \wedge \overline{Q2})$$
$$D2 = (\overline{A} \wedge Q1) V (A \wedge Q1 \wedge \overline{Q2})$$  (5)

Figure 5A:
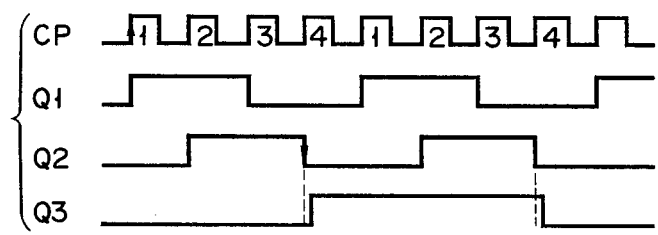
FIGS. 5A, 5B and 5C show sets of timing diagrams useful in explaining the operation of the first variable frequency divider shown in FIG. 2.

The operation of the variable frequency divider 16 thus constructed will be described with reference to FIGS. 5A, 5B and 5C. If the output CP3 of the rate multiplier 18, i.e. the control signal A, is logical "0", from the equation (5), we obtain $D1=\overline{Q2}$ and $D2=Q1$. From this result, D1 and D2 are obtained irrespective of the logical value of the control signal B. Therefore, the state of the respective flip-flops is determined every time the clock pulse reaches. The time charts in this case are shown in FIG. 5A. When the inverted output $\overline{Q1}$ of the flip-flop 31a is considered as the output signal from the first variable frequency divider 16, the frequency dividing ratio K is given by K=K1=4.

Figure 5B:
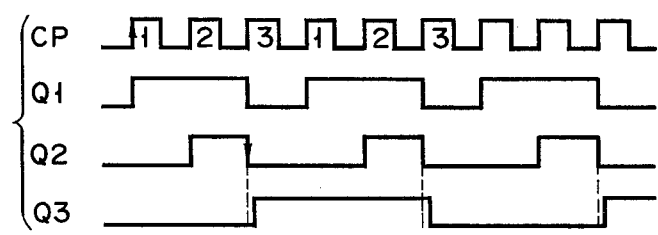
Figure 5C:
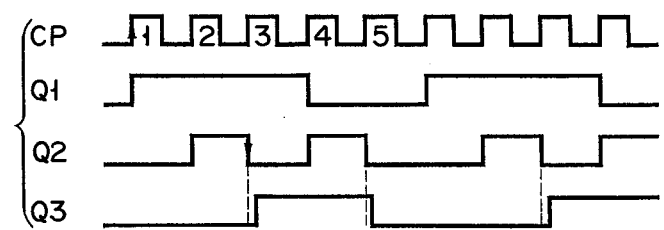

When the signal A is "1" and the signal B is "0", from the equation (5), we obtain $D1=\overline{Q2}$ and $D2=Q1 \wedge \overline{Q2}$ and the time charts in this case are as shown in FIG. 5B and the frequency dividing ratio K is given by K=K1−1=3. Further, when the signal A is "1" and the signal B is "1", the results, $D1=\overline{Q3}$ and $D2=Q1 \wedge \overline{Q2}$ are obtained from the equation (5) and the time charts in this case are as shown in FIG. 5C and the frequency dividing ratio K is expressed by K=K1+1=5.

As described above, when the output signal of the rate multiplier 18 is "1", the frequency dividing ratio of the first variable frequency divider 16 becomes K=K1−1 or K=K1+1 in accordance with the logical state "0" or "1" of the control signal B. In other words, the ratio K is increased or decreased by 1 with respect to K1, that is to say, it is variable.

The operation of the variable frequency dividing circuit 12 including the first variable frequency divider 16 will be described hereinafter. The operation period of the rate multiplier 18 corresponds to P input pulses CP2 (in the example of FIG. 3, eight pulses). During this period, the frequency dividing ratio K of the first variable frequency divider 16 is increased or decreased by 1 from K1 during a period corresponding to Q of the input pulses CP. The input pulse CP is frequency-divided by the first variable frequency divider 16 to have a 1/K frequency. The frequency-divided signal is applied as the pulse CP1 to the second variable frequency divider 17. Therefore, the operation period of the variable frequency dividing circuit 12 as a whole corresponds to (klmP±Q) input pulses. Accordingly, P output pulses CP2 appear with a period of (KlmP±Q) at the output terminal of the second variable frequency divider 17 which is the output terminal of the variable frequency dividing circuit 12. The frequency dividing ratio N of the variable frequency dividing circuit 12 is generally expressed by the following equation (6):

$$N=(Klmp \pm Q/P) = Klm \pm Q/P$$  (6)

The symbols "+" and "−" in the equation (6) correspond to the cases where the control signal B is "1" and "0", respectively. From this equation, when P=8 and Q=0, 1, 2, ... 7, the frequency dividing ratios are tabulated as shown in Table 1.

TABLE 1

| P | Q | Klm ± Q/P |
|---|---|-----------|
| 8 | 0 | Klm |
| 8 | 1 | Klm ± 0.125 |
| 8 | 2 | Klm ± 0.25 |
| 8 | 3 | Klm ± 0.375 |
| 8 | 4 | Klm ± 0.5 |
| 8 | 5 | Klm ± 0.625 |
| 8 | 6 | Klm ± 0.75 |
| 8 | 7 | Klm ± 0.875 |

As seen from Table 1, the frequency ratio is changed with equal intervals of 0.125=⅛. The interval may further be fractionized by selecting a larger value of P. This can readily be realized by increasing the number of stages of the flip-flops constituting the synchronous counter in the case of FIG. 3.

When the frequency synthesizer as shown in FIG. 2 is constructed by using the variable frequency dividing circuit 12 mentioned above, the oscillating frequency $f_{oi}$ of VCO 11 is given from the equations (1) and (6) under a phase-locked condition, $$f_{oi} = (Klm \pm Q/P)f_{ref}$$  (7)

Assuming now that P=P1 and Q=0, 1, 2, ... P1−1, in the equation (7), the frequency $f_{oi}$ changes between $(klm-1)f_{ref}$ and $(Klm+1)f_{ref}$ by a discrete step Δf given by the following equation (8).

$$\Delta f = f_{ref}/P$$  (8)

The discrete step Δf of a change of the oscillating frequency $f_{oi}$ of VCO 11 is fractionalized up 1/P of the reference frequency $f_{ref}$, as seen when it is compared with the equation (2) of the conventional frequency synthesizer. Therefore, it is not necessary to set the oscillating frequency $f_{ref}$ to be an excessive small value so that the frequency dividing ratio of the variable frequency dividing circuit 12 may be set up at a relatively large value and thus the feedback loop is free from the reduction of a loop gain. Further, a stable oscillator such as a crystal oscillator may be used and hence the oscillating frequency $f_{oi}$ of VCO 11 to be phase-locked by the frequency of the reference oscillator 14 may be kept stably. Additionally, since the frequency $f_{oi}$ of VCO 11 may be changed while fixing the oscillating frequency of the reference oscillator 14, the discrete change step $\Delta f$ of the change of the frequency $f_{oi}$ may be kept always constant as seen from the equation (7).

As described above, a novel variable frequency dividing circuit of which the frequency dividing ratio is below 1 and may be changed with discrete intervals is used for the variable frequency dividing circuit for frequency-dividing the output signal from VCO 11 and for applying the frequency-divided one to the phase comparator. Therefore, the discrete step change of the oscillating frequency of VCO 11 may uniformly be fractionalized even though a stable oscillator such as a crystal oscillator is used for the reference oscillator. Further, the loop gain of the feedback loop system is not reduced. The frequency synthesizer according to the invention is very practicable.

The invention may be modified variously and some modifications will be described hereinafter.

Figure 6:
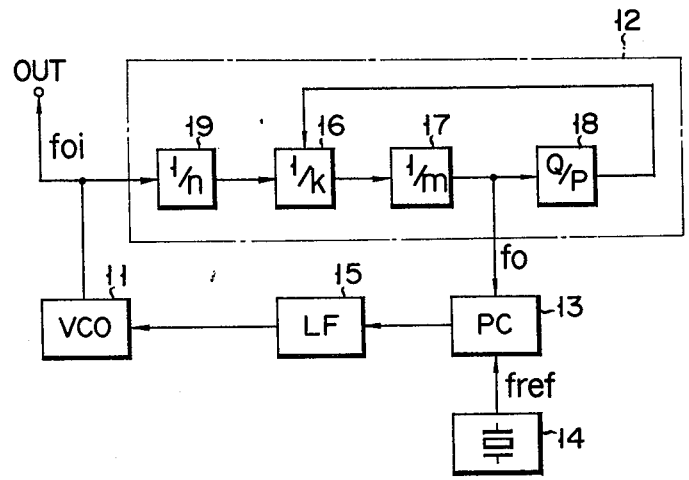
FIGS. 6 to 8 show block diagrams showing other embodiments of the frequency synthesizer according to the invention.

A modification shown in FIG. 6 has an additional prescaler or a pre-stage frequency divider 19 with the frequency dividing ratio 1/n provided at the pre-stage of the first variable frequency-divider 16 shown in FIG. 2. The remaining circuit construction of the modification is the same as that of FIG. 2. The oscillating frequency $f_{oi}$ of VCO 11 of FIG. 6 is expressed by an equation (9)

$$f_{oi} = n(K1m \pm Q/P)f_{ref} \quad (9)$$

As seen from the equation (9), the use of the pre-stage frequency-divider 19 provides an output pulse of VCO 11 being not directly applied to the variable frequency divider 16. For this, the variable frequency divider 16 is little influenced by a variation of the output signal of VCO 11.

Although the embodiments shown in FIGS. 2 and 6 use the output signal from the second variable frequency divider 17 as the input signal to the rate multiplier 18, the output signal from the reference oscillator 14 may also be used as the input signal to the rate multiplier 18. This may readily be understood from the fact that the output signal from the second variable frequency divider 17 in the feedback loop is finally phase-locked.

Figure 7:
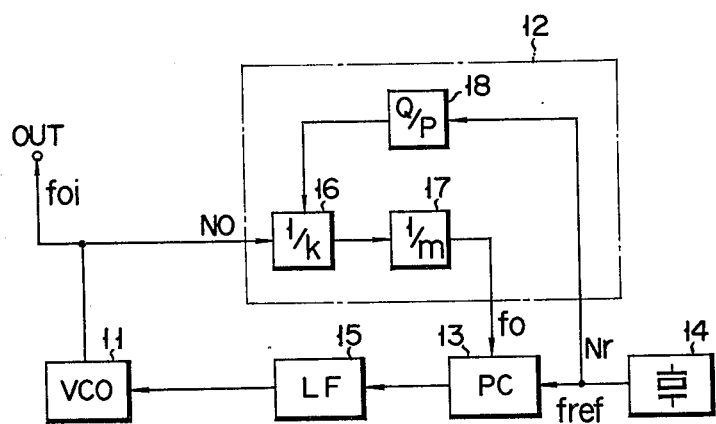

An embodiment shown in FIG. 7 directly couples the output frequency $f_{ref}$ of the reference oscillator 14 with the rate multiplier 18. In this case, it is assumed that the number of output pulses from VCO 11 per a unit time period is No and that of the reference oscillator 14 is Nr. When the former signal is phase-locked by the latter signal, the following relation holds $$Nr = 1/K1m(No \pm Nr \cdot Q/P) \quad (10)$$

More specifically, in the variable frequency divider 16, the number No of the input pulses is increased or decreased by $Nr \cdot Q/P$ and the result of the increase or decrease is divided by 1/K1. Thus, the number of output pulses from the variable frequency divider 16 is expressed as $(No \pm Nr \cdot Q/P)1/K1$. These output pulses are further applied to the frequency divider 17 where those are frequency-divided by 1/m and the number of pulses resulting from the frequency division is equal to the number of the reference pulses Nr when the former pulses are phase-locked by the latter pulses. The following equation holds $$(No \pm Nr \cdot Q/P)1/K1m = Nr$$

The number of pulses per a unit time period means frequency and hence $$f_{ref} = 1/K1m(f_{oi} \pm f_{ref}Q/P) \quad (11)$$

When rewriting the equation (11) with respect to the oscillating frequency $f_{oi}$ of VCO 11, we have the same equation as that (7) expressing the oscillating frequency $f_{oi}$.

Figure 8:
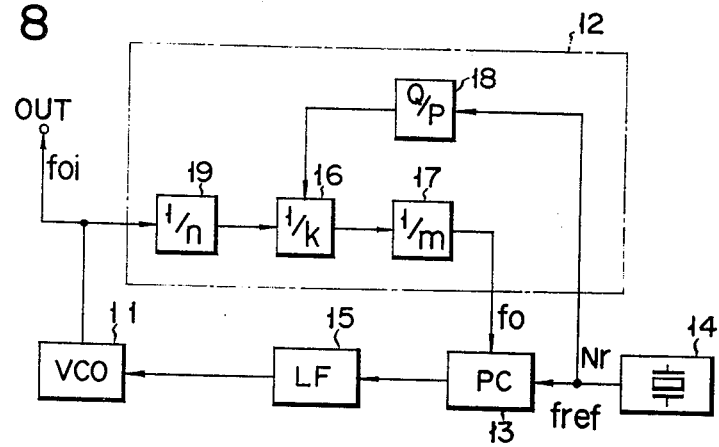

An embodiment shown in FIG. 8 uses the output signal from the reference oscillator 14 for the input signal to the rate multiplier 18. The remaining circuit construction is the same as that of FIG. 6. In the embodiment shown in FIG. 8, the frequency $f_{oi}$ of VCO 11 also is given by the equation (9).

The frequency synthesizer according to the invention is very useful when it is assembled into the electronic tuner of a TV set, and further FM and AM radio receivers, transceivers, measurement equipments, and the like.

Figure 9:
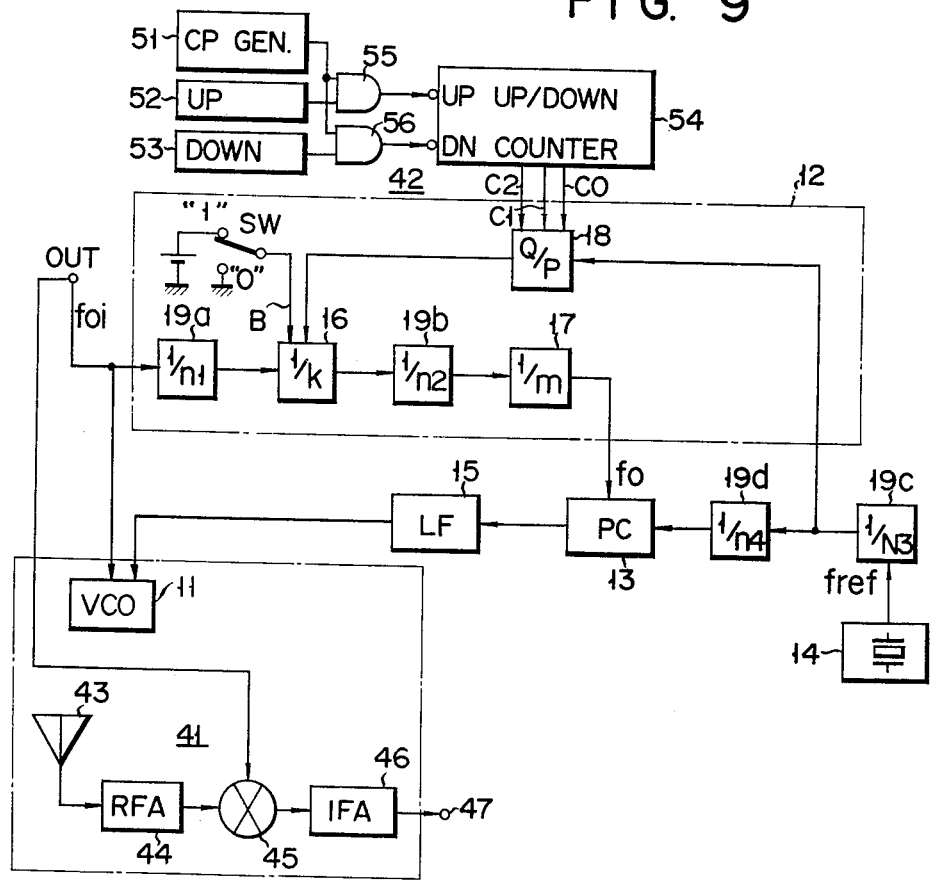
FIG. 9 shows a block diagram when an additional embodiment of the frequency synthesizer according to the invention is applied to a television receiver.

Turning now to FIG. 9, there is shown an embodiment in which the frequency synthesizer according to the invention is incorporated into an electronic tuner of a television set. In the frequency synthesizer portion thereof, a pre-scaler 19a of the frequency dividing ratio 1/n1 is provided at the prestage of the variable frequency divider 16. Pre-scalers 19c and 19d with the frequency dividing ratios 1/n3 and 1/n4 are inserted between the reference oscillator 14 and the phase comparator 13. A pre-scaler 19b with the frequency dividing ratio 1/n2 is inserted between the frequency dividers 16 and 17. The output signal from the pre-scaler 19c is inputted to the rate multiplier 18. In this case, the oscillating frequency $f_{oi}$ of VCO 11 is given by $$f_{oi} = n1K1 \left(mn2 \pm \frac{n4}{K1} \cdot \frac{Q}{P}\right) \frac{f_{ref}}{n3n4} \quad (12)$$

More specifically, since the frequency of the input signal to the rate multiplier 18 is $f_{ref}/n3$, the frequency of the output signal of the rate multiplier 18 is $(f_{ref}/n3) \cdot (Q/P)$. The output frequency of the pre-scaler 19a is $f_{oi}/n1$ and therefore the frequency of the output signal of the first variable frequency divider 16 is $$\left(\frac{f_{oi}}{n1} \pm \frac{f_{ref}}{n3} \cdot \frac{Q}{P}\right) \cdot \frac{1}{K1}.$$

This frequency is frequency-divided by the frequency dividers 19b and 17 to be 1/n2 and 1/m, successively. The frequency of the output signal from the frequency divider 17 is given by $$f0 = \left(\frac{f_{oi}}{n1} \pm \frac{f_{ref}}{n3} \cdot \frac{Q}{P}\right) \frac{1}{K1n2m}$$

In the phase-locked condition, the frequency f0 is equal to the frequency $f_{ref}/n3n4$ and hence $$( \frac{f_{oi}}{n1} \pm \frac{f_{ref}}{n3} \cdot \frac{Q}{P} ) \frac{1}{K1n2m} = \frac{f_{ref}}{n3n4}$$

When rearranging the above equation with respect to the frequency $f_{oi}$, the equation (12) is obtained. Where, the channel-selection of the TV set may be performed by varying the frequency dividing ratios $1/n2$ and/or $1/m$ of the variable frequency dividers 17, 19b. This channel-selection method is well known and the further explanation may be omitted. The embodiment shown in FIG. 9 is further provided with an electronic tuner 41 and a fine adjustment unit 42 for finely adjusting the receiving frequency. The electronic tuner 41 is comprised of a radio frequency amplifier 44 for amplifying a television signal received by an antenna 43, a mixer 45 for mixing the amplified television signal with the output signal from VCO 11 with the frequency $f_{oi}$ fed through the output terminal OUT to form an intermediate frequency signal, and an intermediate frequency signal amplifier 46 which amplifiers the intermediate frequency signal and delivers the amplified one from the output terminal 47 to the succeeding stage such as a video detector. The frequency synthesizer can provide an extremely stable and precise signal as a local oscillating frequency signal applied to the mixer 45, thereby ensuring a good receiving condition in the TV set.

The fine adjustment of the local oscillating frequency may properly be made by means of the fine adjustment unit 42. The fine adjustment unit 42 is comprised of a clock pulse generator 51 for generating clock pulses with a low frequency, an UP count indication key 52, a DOWN count indication key 53, and a couple of AND gates 55 and 56 which respond to the outputs delivered from the indication keys 52 and 53 to apply the clock pulses to the UP terminal of the UP/DOWN counter 54 and the DOWN terminal thereof. The UP/DOWN counter 54 is, for example, a scale-of-8 counter and the 3-bit output signal representing the count 0 to 7 is applied as control signals c2, c1 and c0 to the rate multiplier 18 shown in FIG. 3.

When a picture being currently received by a television receiver is detuned, a user presses the UP count indication key 52 or the DOWN count indication key 53. When the UP count indication key, for example, is pressed, the AND gate 55 is open so that the clock pulse is supplied to the UP terminal of the UP/DOWN counter 54 to effect the UP count. If the control signal B is set "1" and the factor Q/P of the rate multiplier 18 has been set up at ⅜, the factor Q/P takes 4/8, ⅝, ... in accordance with the count of the UP/DOWN counter 54 so that the frequency $f_{oi}$ of the output signal from VCO 11 slightly rises as seen from the equation (12). While observing the television picture, the user continues the depression of the key 52 until a good picture is obtained. When the DOWN count indication key 53 is depressed, with maintaining the state of the signal B as "1", the UP/DOWN counter 54 is counted down, and the frequency dividing ratio of the variable frequency divider 16 is discretely decreased while the frequency of the output signal decreases discretely.

Thus, the state B="1" means the symbol in the equation (12) as "+", and the operation of the UP count indication key or the DOWN count indication key results the change of the frequency $f_{oi}$ of VCO 11 by the discrete step frequency $(n1 \cdot f_{ref}/n3 \cdot P)$ between $$f_{oi} = niK1 \, (mn2) \, (f_{ref}/n3n4)$$

and $$f_{oi} = niK1 \, (mn2 + n4/K1) \, (f_{ref}/n3n4)$$

Similarly, the symbol in the equation (12) should be "−" in the case of B="0", and the frequency $f_{oi}$ of VCO 11 changes between $$f_{oi} = n1K1 \, (mn2) \, (f_{ref}/n3n4)$$

and $$f_{oi} = n1K1 \, (mn2 - n4/K1) \, (f_{ref}/n3n4).$$

What we claim is:

1. A frequency synthesizer for synthesizing frequencies with a phase-locked loop in which the frequency of the output signal from a voltage controlled oscillator is divided by a variable frequency dividing circuit and the output signals from the variable frequency dividing circuit and a reference frequency oscillator are applied to a phase comparator and an output signal corresponding to the result of the phase comparison is fed back to the voltage controlled oscillator, wherein said variable frequency dividing circuit is comprised of:
  a first variable frequency divider for frequency-dividing the frequency of the output signal from the voltage controlled oscillator into a $1/K-1$, $1/K$ or $1/K+1$ frequency (K is a fixed integer);
  means for designating one of frequency division ratios $(K-1, K, K+1)$ of the first variable frequency divider;
  a second variable frequency divider for further frequency dividing the frequency of the output signal from the first variable frequency divider into a $1/m$ frequency (m is a variable integer);
  means for applying a frequency signal as a reference frequency signal being used in the phase locked loop;
  a signal generating means which receives an output signal of said reference signal applying means and generates Q pulses (Q is an integer between 0 to $P-1$ where P is an integer) when received P pulses;
  means for varying the value Q between 0 to $P-1$;
  means for controlling the operation of the first variable frequency divider in accordance with an output of the frequency division ratio designating means and the output signal from said signal generating means; and
  means for applying the output signal from said second variable frequency divider to the phase comparator.

2. A frequency synthesizer according to claim 1, wherein the reference frequency is obtained from the reference frequency oscillator.

3. A frequency synthesizer according to claim 2, wherein said variable frequency dividing circuit includes a first pre-scaler connected to a pre-stage of said first variable frequency divider.

4. A frequency synthesizer according to claim 3, wherein said variable frequency dividing circuit includes a second pre-scaler connected between said first and second variable frequency dividers.

5. A frequency synthesizer according to claim 1, wherein the reference frequency is obtained from the output of said second variable frequency divider.

6. A tuner for a television receiver comprising:

a frequency synthesizer for synthesizing frequencies with a phase-locked loop in which the frequency of the output signal from a voltage controlled oscillator is applied to a variable frequency dividing circuit and is divided thereby and the output signals from the variable frequency dividing circuit and a reference frequency oscillator are applied to a phase comparator and the output signal corresponding to the result of the phase comparison is fed back to the voltage controlled oscillator, wherein said variable frequency dividing circuit is comprised of:

a first variable frequency divider for frequency-dividing the frequency of the output signal from the voltage controlled oscillator into a $1/K-1$, $1/K$ or $1/K+1$ frequency (K is a fixed integer);

means for designating one of frequency division ratios $(K-1, K, K+1)$ of the first variable frequency divider;

a second variable frequency divider for further frequency dividing the frequency of the output signal from the first variable frequency divider into a $1/m$ frequency (m is a variable integer);

means for applying a frequency signal as a reference frequency signal being used in the phase locked loop;

a signal generating means which receives an output signal of said reference signal applying means and generates Q pulses (Q is an integer between 0 to $P-1$ where P is an integer) when received P pulses;

means for varying the value Q between 0 to $P-1$;

means for controlling the operation of the first variable frequency divider in accordance with an output of the frequency division ratio designation means and the output signal from said signal generating means;

means for applying the output signal from said second variable frequency divider to the phase comparator;

a tuner portion for forming an intermediate frequency signal by using the output frequency signal from said frequency synthesizer as a local oscillation frequency signal of the television receiver; and means for supplying a control signal to said signal generating means in order to finely adjust the frequency of the output signal from said frequency synthesizer.

7. A frequency synthesizer according to claim 1, wherein said reference frequency inputs said signal generating means and said phase comparator.

* * * * *